(12) United States Patent
Velez et al.

(10) Patent No.: US 7,119,373 B2
(45) Date of Patent: Oct. 10, 2006

(54) SLED

(75) Inventors: Christian Velez, Richterswil (CH); Raffaele Rezzonico, Zürich (CH)

(73) Assignee: Exalos AG, Zurich (CH)

( * ) Notice: Subject to any disclaimer, the term of this patent is extended or adjusted under 35 U.S.C. 154(b) by 7 days.

(21) Appl. No.: 10/763,508

(22) Filed: Jan. 23, 2004

(65) Prior Publication Data

US 2005/0161685 A1    Jul. 28, 2005

(51) Int. Cl.
*H01L 27/15* (2006.01)
(52) U.S. Cl. ............... 257/84; 257/91; 257/94; 257/99; 257/103; 257/432; 257/620
(58) Field of Classification Search ......... 257/79–103
See application file for complete search history.

(56) References Cited

U.S. PATENT DOCUMENTS

| | | | | |
|---|---|---|---|---|
| 5,227,646 A | * | 7/1993 | Shigeno | 257/80 |
| 5,252,839 A | * | 10/1993 | Fouquet | 257/13 |
| 5,577,064 A | * | 11/1996 | Swirhun et al. | 372/96 |
| 6,184,542 B1 | | 2/2001 | Alphonse | |

FOREIGN PATENT DOCUMENTS

EP    0 301 438 A2    2/1989

OTHER PUBLICATIONS

WO 2004/005985 A1, "A Superluminescent Diode", Publication Date: Jan. 15, 2004.
Okamoto, H., et al., "A Narrow Beam 1,3-MUM-Super Luminescent Diode Integrated With a Spot-Size Converter and a New Type Rear Absorbing Region", Journal of Lightwave Technology, IEEE, New York, USA, Oct. 1998, pp. 1881-1887, vol. 16, No. 10, , XP000793326.

* cited by examiner

*Primary Examiner*—Long Pham
*Assistant Examiner*—Wai-Sing Louie
(74) *Attorney, Agent, or Firm*—Rankin, Hill, Porter & Clark LLP

(57) ABSTRACT

A non-lasing superluminescent light emitting diode (SLED) comprises a semiconductor heterostructure forming a PN junction and a waveguide defining an optical beam path. The heterostructure includes a gain region and an absorber region in series with the gain region in the optical beam path. A voltage is applied to the PN junction in the gain region by first contact means, so that light emission from the active region and along the optical beam path is produced. According to the invention, second contact means are provided, contacting the PN junction in the absorber region and operable to remove charge carriers generated by absorption in the absorber region. The second contact means are not connected to a voltage source, but to a charge carrier reservoir such as a metal surface. According to a preferred embodiment, the two end facets of the waveguide are perpendicular to the optical beam path.

13 Claims, 3 Drawing Sheets

SLED

FIELD OF THE INVENTION

This invention is in the field of broadband light sources. It more particularly relates to a superluminescent light emitting diode (SLED) with a gain region and an absorber region.

BACKGROUND OF THE INVENTION

Superluminescent light emitting diodes (SLEDs) are diodes that, when biased in the forward direction, become optically active and generate amplified spontaneous emission over a wide range of wavelengths. In contrast to laser diodes, there is not sufficient feedback to achieve lasing action ("lasing" here is used to describe the function principle of a laser, i.e. to generate, by a feedback, stimulated emission in a gain medium pumped to provide population inversion and placed in a cavity providing the feedback, resulting in coherent radiation). This is usually achieved by the joint action of a tilted waveguide in which the generated radiation is guided and anti-reflection coated end facets. A tilted waveguide in this context is a waveguide which is not perpendicular to a plane defined by end facets of the device.

SLEDs (sometimes also called Superluminescent diodes, SLDs) are attractive for applications in which a higher intensity than the one emitted by conventional LEDs is required, but where an even distribution of the emitted wavelength over a broad spectral range is desired. In a SLED for delivering a large incoherent light output from the first end facet, it is thus important to suppress laser oscillation.

U.S. Pat. No. 5,252,839 discloses a way to, in addition to non-perpendicular end facets and AR coatings, further reduce feedback generation and thus the tendency of the device to lase. This is done by providing two regions in a waveguide structure with a PN-junction, the first region being forward biased to serve as gain region, and the second region being reverse biased to serve as optical absorber region by Stark absorption or Franz-Keldysch effect. In this way, power loss in the cavity is further enhanced, feedback further reduced, and a brighter non-lasing light source becomes possible, at the cost of a more complicated set-up.

Modern SLEDs include devices with conventional bulk structures as well as devices with structures composed of a plurality of very thin layers (so-called quantum well structures) deposed on a single crystal substrate. Mass production of such bulk semiconductors and quantum well structures is well developed and would allow the production of SLEDs rationally and economically. However, the tilted waveguide or other means of achieving non-perpendicular end facets make it difficult to package SLED devices by standard production methods.

SUMMARY OF THE INVENTION

It is an object of the present invention to provide a superluminescent light emitting diode which overcomes disadvantages of prior art superluminescent light emitting diodes and which especially is inexpensive to manufacture using standard production methods, allows for operation with a high output intensity and nevertheless reliably avoids lasing action.

Accordingly, a SLED is presented comprising a semiconductor heterostructure forming a PN junction and a waveguide defining a optical beam path, the heterostructure including a gain region and an absorber region in series with the gain region in the optical beam path. By first contact means, a voltage may be applied to the PN junction in its forward direction in the gain region, so as to inject a current and produce light emission from the active region and along the optical beam path. The produced light propagates through the waveguide to both sides. Light that is guided to the absorber region is absorbed. The absorbed photons will generate electron-'hole' pairs, which, when not dissipated can recombine and generate light again. In addition, a high population of electron-hole-pairs has a bleaching effect on the absorbers. Therefore, the separation of the electron-holes pairs is achieved by contacting the light-absorption segment, for example with a metallic surface. The electrons will then flow to the metal and be separated from the holes, so that light is efficiently and continuously absorbed. In other words, the PN junction in the absorber region is contacted, too, so that charge carriers (i.e. electrons and holes) generated in the absorber process may be dissipated. By this contact the PN junction in the absorber region is kept essentially at zero bias, and bleaching of the absorber is prevented.

"Light" in the context of this document refers to electromagnetic radiation, in particular electromagnetic radiation that can be produced by injecting current in a semiconductor heterostructure, including infrared light (especially in the near and mid infrared region), visible light and, under special circumstances, also ultraviolet radiation.

The efficient absorber mechanism provided by the above described principle makes it possible to provide end facets of the waveguide which are perpendicular to the waveguide direction. This geometry—in connection with the requirement of only one voltage to be applied—allows the use of standard casings such as the "TO cans" known for laser diodes. State of the art SLEDs with tilted waveguides in contrast have to be provided with specialized housings. The use of standard casings allows drastic reduction of the costs of housed SLED devices.

The photocurrent created in the absorber region is proportional to the absorbed radiation. It may be tapped to be a measure for the intensity of the radiation generated in the gain region.

The semiconductor heterostructure preferably includes a stack of parallel layers forming the PN junction. The layers may comprise an active layer embedded in top and bottom cladding layers having a smaller refractive index, thus defining the waveguide in vertical (i.e. perpendicular to the layer plane) direction. The active region is preferably adjacent to a first end facet, whereas the light-absorption region may be adjacent to the second end facet. The optical waveguide continuously extends from the active region current to the light-absorption region.

BRIEF DESCRIPTION OF THE DRAWINGS

In the following, embodiments of the invention are described with reference to drawings. All drawings are schematic and not to scale. In the different drawings, corresponding elements are provided with same reference numerals.

DESCRIPTION OF THE PREFERRED EMBODIMENTS

Figure 1:
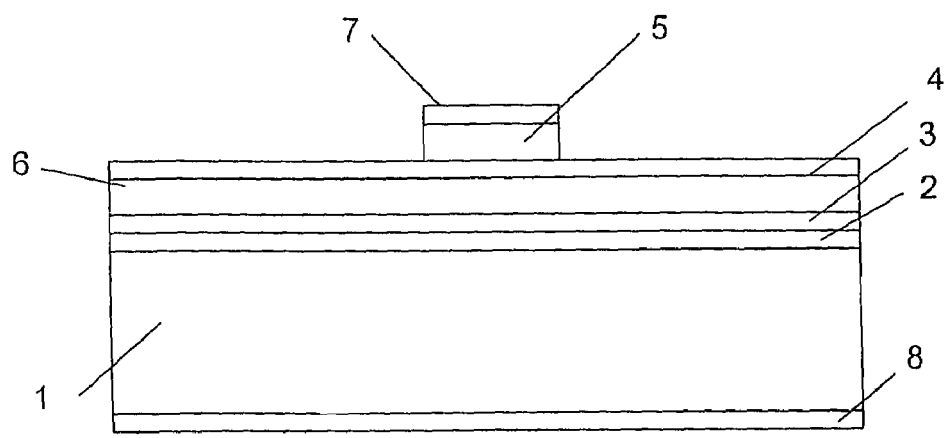
FIG. 1 shows a traverse section of a device according to the invention.

The device schematically shown in FIG. 1 comprises a semiconductor heterostructure including a GaAs substrate 1. The substrate comprises an Si-doped (the Si doping here being an n-doping) InGaP semiconductor cladding layer 2. On top of the Si-doped cladding layer, a layered structure forming a PN-junction is placed. In the shown embodiment, the PN-junction is formed by an undoped InGaAsP 'bulk' structure layer 6, between an Si-doped InGaAsP cladding layer 3 and a Zn-doped (the Zn-doping being a p-doping) InGaAsP cladding layer 4. The layered structure is covered by a Zn-doped InGaP cladding layer 5. The indexes of refraction of the n-doped and the p-doped cladding layers 3, 4 are higher than the index of refraction of the active 'bulk' layer 6, so that a waveguide is formed for light generated in the PN junction upon injection of a current. Lateral confinement is achieved by a ridge waveguide structure (weakly index guided structure). For injecting a current, the device comprises two metal electrodes 7, 8, through which charge carriers may be injected in the n- and in the p-doped side of the PN junction. In the shown configuration, the direction of the current is from the top to the bottom in FIG. 1; the current is guided through the substrate to the electrode on the n-side. In the shown embodiment the bottom electrode 8 (being the n-electrode) is at the same time a contacting layer of the underlying carrier element 9, for example being a printed circuit board element or an other kind of electrical connecting element.

Figure 2:
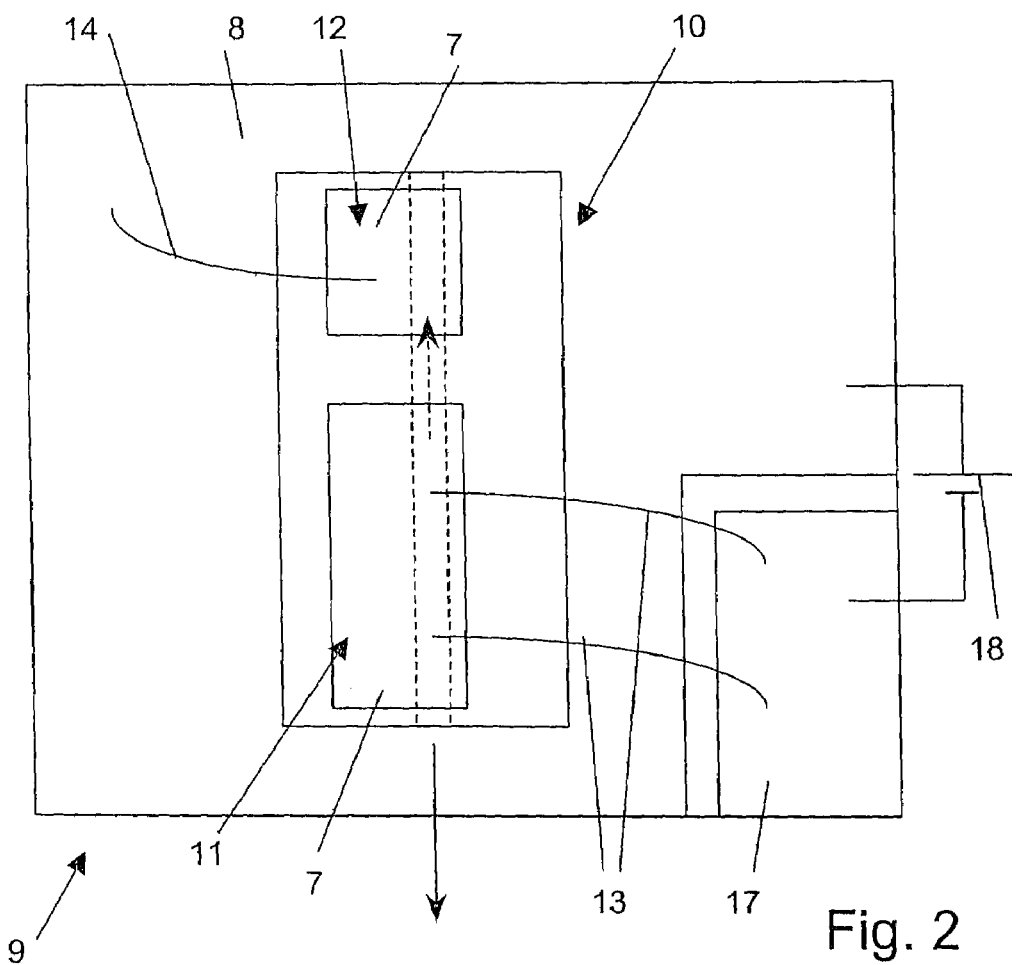
FIG. 2 is a top plan view of the device of FIG. 1

As can best be seen in FIG. 2, the heterostructure 10 in the longitudinal direction, i.e. in the light path direction, comprises two regions in series to each other. In the active region 11, the top electrode 7 (or p-electrode) is contacted by wire bonds 13 and is in connection with a current source. An external voltage source 18 applying a voltage between a plus contact area 17 and the bottom electrode 8 is schematically depicted. In the figure, two wire bonds are shown, however, also one wire bond or any number of wire bonds may be chosen for supplying a current to the active region 11.

According to the invention, an absorber region 12 is provided. The absorber region 12 comprises the same kind of PN junction as the active region (i.e. the layer structure shown in FIG. 1 is not substantially varied longitudinally, apart from interruptions of the top electrode 7 in the manner shown in FIG. 2. This brings about the advantage of straightforward manufacturing. Further, the electronic structure in the absorber region corresponds to the electronic structure in the active region, so that light emitted in the active region is efficiently absorbed in the absorber region. According to less preferred embodiments the layer composition and thus the electronic structure in the absorber region differ from the according composition/structure in the active region, however, the band gap must not be substantially greater in the absorber region than in the active region.

The top electrode in the absorber region is contacted by a wire bond 14 and thus is connected to the bottom electrode, so that the PN junction is kept at zero bias. The bottom electrode in this embodiment serves as charge carrier reservoir where charge carriers generated by absorption in the semiconductor material in the optical path may dissipate to. Instead of connecting the top electrode to the bottom electrode, it may also be connected to an other kind of reservoir, for example to any metal surface provided on the carrier element 9, to a casing etc, or to any element that is kept at a defined potential corresponding to the bottom electrode potential or that has a sufficient capacity or charge carrier dissipation to absorb the photoelectric current generated in the absorber without being charged. The only requirement of such a reservoir, in fact, is that it prevents the semiconductor material from being charged by generated charge carriers.

As can be also seen in FIG. 2, the two end facets of the waveguide (indicated by dashed lines in the Figure) are perpendicular to the waveguide direction, i.e. the optical beam path. This brings about advantages in fabrication and allows the use of housings and other optical components known for laser diodes. The parallel end facets build a Fabry-Perot-etalon that could be a resonator for (undesired) lasing action. However, due to the absorber region according to the invention, despite the Fabry-Perot-setup, lasing action is prevented.

Although end facets perpendicular to the optical beam path are advantageous for many applications, the invention is not restricted to such a waveguide arrangement but includes configurations where at least one end facet (for example the one closer to the absorber region) is not perpendicular to the beam path direction.

In addition to the shown measures, antireflection coatings (not shown) may optionally be provided at one of the facets or at both facets.

Further, the photocurrent discharged through the wire bond 14 may be measured in order to obtain a monitoring signal for the intensity of the radiation created in the gain region. This principle is based on the insight that in an unbleached absorber (for example an unbiased PN junction) the absorbed photocurrent is proportional to the incoming light intensity. The wire bond is electrically connected to a measuring device (not shown) and only through this connection with the other electrode or with an other kind of charge reservoir. The photocurrent is a relative measure for the intensity and also depends on other factors such as layer thicknesses, geometry etc. If an absolute light intensity signal is desired, the monitoring means first have to be calibrated.

Figure 5:
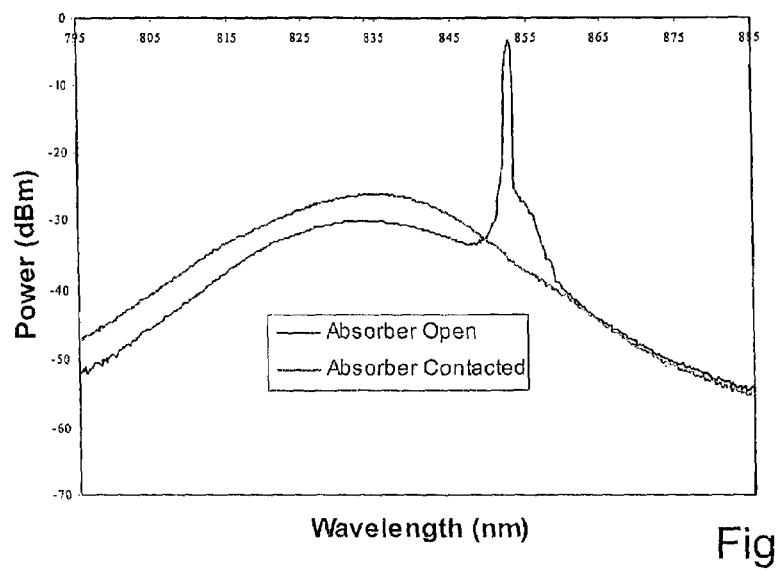
FIG. 5 depicts power spectra for a device according to the invention and a reference sample.

FIG. 5 shows the effect of contacting the absorber region, where a spectrum of the emitted power is shown for a device as shown in FIG. 5. Without the contact of the absorber, the spectrum, at the chosen overall intensity, comprises a peak. This peak may be attributed to a resonance frequency of the Fabry-Perot resonator built between the two end facets and is clearly indicative of undesired lasing action. Once the absorber region is contacted, the spectrum exhibits an even distribution.

While the active region in the shown embodiment (length 500 μm) is larger than the absorber region (250 μm, for a total chip length of 1000 μm, the distance between gain and absorber being 250 μm), this does not have to be the case. Instead, a large variety of different geometrical configurations is possible, including configurations where the absorber region is larger than the gain region.

Instead of using wire bonds, the absorber region (as well as, in fact, the active region) may also be contacted by a metal stripe or any type of wire or metal connection.

The possible materials of the semiconductor heterostructure include InP, GaAs and all other known or yet to be discovered suitable semiconductor materials; p-doped and n-doped according to the scheme set out above.

In all shown embodiments, p-doped layers and n-doped layers can be interchanged.

Figure 3:
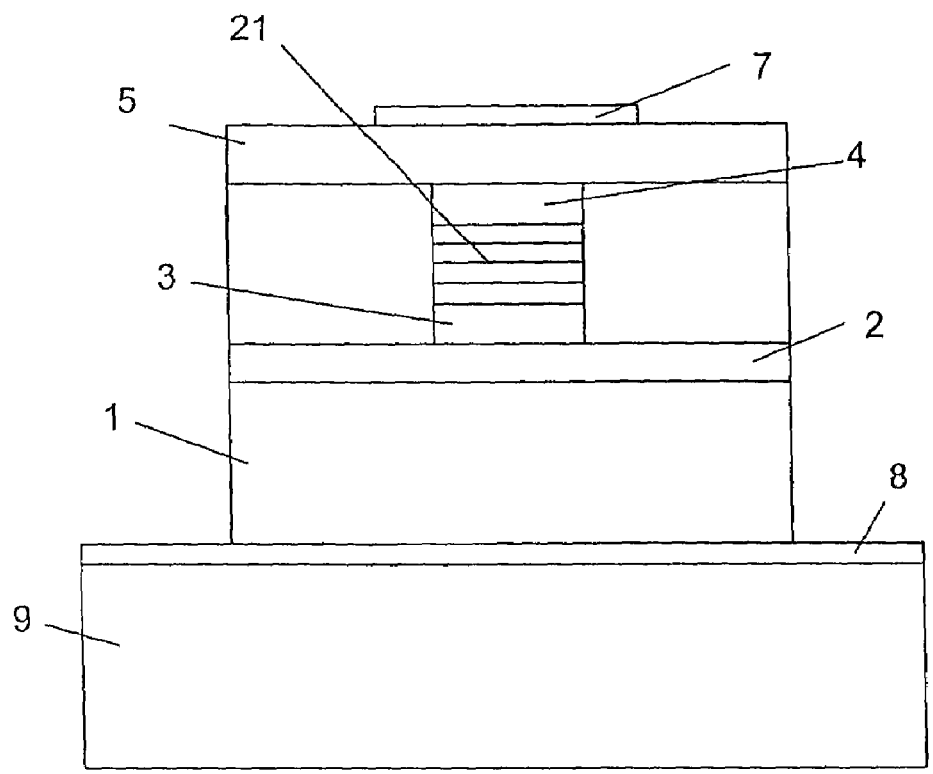
FIGS. 3 and 4 are traverse sections of further embodiments of the invention
Figure 4:
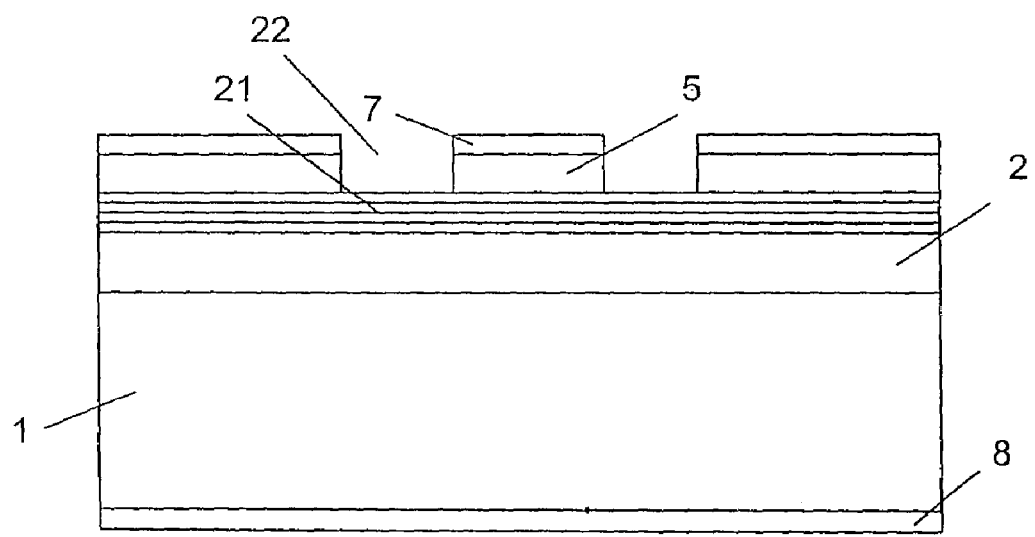

FIGS. 3 and 4 depict further heterostructures of embodiments of the invention. In the embodiment of FIG. 3, the light in the PN junction as well as the active layer are laterally confined by material of a high index of refraction 21 such as any semiinsulation layer which can be growth lattice matched on the corresponding substrate (e.g. InP:Fe for InP devices), whereas in FIG. 4, lateral confinement is achieved by two channels 22 defining a ridge in-between. The channels in the shown embodiment interrupt the p-doped electrode and the cladding layer, but could also go deeper. The strong index guided (FIG. 3) and weak index guided (FIG. 4) heterostructures further differ from the embodiment shown in FIG. 1 in that instead of a bulk PN-junction, a multiple quantum well structure 21 is provided. Such MQW structures provide an increased vertical confinement of luminescence and thus increase the intensity. As an example, the wells of the MQW structure may be (on InP) made of undoped Ga0.23In0.77As0.84P0.16 and barriers of undoped Ga0.46In0.54As0.8P0.2.

Instead of bulk or MQW structures other configurations around the PN junction may be used, for example single quantum well, quantum wire, quantum dot etc (c.f. Peter Zori, "Quantum Well Lasers", Academic Press 1986). MQWs and other layered configurations as such are known in the art and will not be described in further detail here.

Both, the set-up of FIG. 3 and of FIG. 4 for achieving lateral confinement can also be used for 'bulk' structures instead of MQW structures. Further to the shown guiding mechanism, also gain guided structures—similar to the ones known from laser diodes—are possible.

Methods of manufacturing semiconductor heterostructures are known from the laser diode and LED manufacturing industry. They are not described here.

Figure 6:
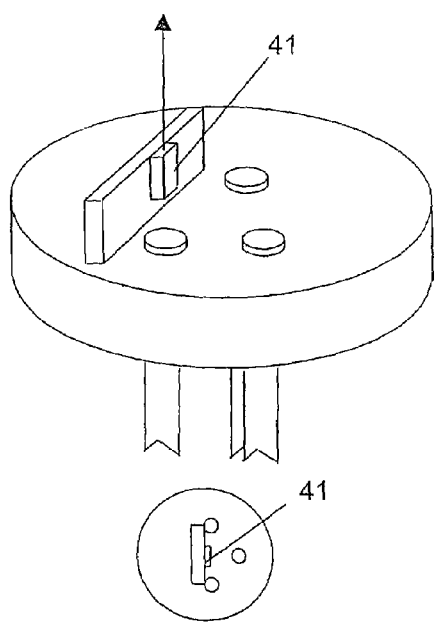
FIG. 6 shows a device according to the invention in a standard casing.
Figure 7:
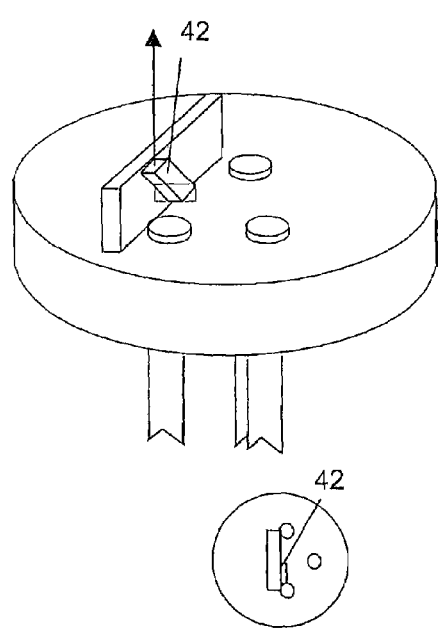
FIG. 7 shows, for comparison, a hypothetical set-up with a prior art device in a standard casing.

FIG. 6 represents an appliance comprising the above described device in a standard housing. Having a straight waveguide 41 instead of a tilted waveguide because of which the chip has to be placed inclined in the housing (as shown in FIG. 7 for comparison) allows the use of TO housings, where the SLED chip can be placed concentric to the housing. The optical path is in the middle of the housing and alignment of small lenses is easier. In other words, the housing comprises a basically cylindrical geometry (except for contact means) and thus has a symmetry axis. The optical beam path is essentially parallel to the symmetry axis and in the shown embodiment coincides with it. The lower panels of both, FIG. 6 and FIG. 7 show a schematic top view with only the front of the chips shown. The disc-like structures within the housings represent electrical contacts.

Various other embodiments may be envisaged without departing from the scope and spirit of this invention.

What is claimed is:

1. An apparatus for producing electromagnetic radiation, the apparatus comprising
    a superluminescent light-emitting diode, the superluminescent light emitting diode comprising a semiconductor heterostructure forming a PN junction and a waveguide defining an optical beam path,
    the heterostructure including a gain region and an absorber region in series with the gain region in the optical beam path,
    a first contact for applying a voltage to the PN junction in its forward direction in the in the gain region, so as to produce light emission from the gain region and along the optical beam path,
    and a second contact contacting the PN junction in the absorber region, the second contact forming a permanent electrical contact between a P doped side and an N doped side of the PN junction in the absorber region, so that the PN junction in the absorber region is unbiased, the apparatus further comprising a housing carrying the superluminescent light-emitting diode, the housing comprising a symmetry axis, wherein said optical beam path is parallel to said symmetry axis, wherein the housing comprises a disk-shaped body with two parallel facets, the symmetry axis being a symmetry axis of said body and being perpendicular to said facets, the housing further comprising electrical contacts penetrating the body in the direction of the symmetry axis, the superluminescent light emitting diode being provided in a semiconductor chip attached to a facet of said body.

2. The apparatus according to claim 1, wherein said second contact includes a wire contact between a layer having the electrical potential of the P side and a layer having the electrical potential of the N side.

3. The apparatus according to claim 1, wherein the PN junction comprises an n-doped side and a p-doped side, and wherein at least one of the n-doped side and the p-doped side is connected, by the second contact, to a metallic surface outside the heterostructure.

4. The apparatus according to claim 1, wherein the waveguide comprises two end facets, limiting the waveguide structure in a longitudinal direction parallel to the optical beam path, the end facets being perpendicular to the optical beam path.

5. The apparatus according to claim 1, wherein the PN junction in the gain region and in the absorber region is a bulk PN junction comprising a p-doped component and an n-doped component, both having a layer thickness exceeding 10 nm.

6. The apparatus according to claim 1, wherein the semiconductor heterostructure in the gain region includes a multiple quantum well (MOW) structure and wherein the PN junction is formed in said multiple quantum well structure, or wherein the semiconductor heterostructure in the gain region includes quantum wires or quantum dots.

7. The apparatus according to claim 1, wherein the waveguide is index guided.

8. The apparatus according to claim 1, wherein the waveguide is gain guided.

9. The apparatus according to claim 1, wherein the semiconductor heterostructure comprises a first cladding layer and a second cladding layer, the PN junction comprises a PN-junction layered structure between the first and the second cladding layer, the PN-junction layered structure comprises a single quantum well structure or a multiple quantum well structure or a bulk layer of a p-doped material and a bulk layer of an n-doped material, the heterostructure further comprises the first cladding layer being in electrical contact to a first metal electrode, the second cladding layer being in electrical contact to a second metal electrode, the first metal electrode or the second metal electrode or both metal electrodes being interrupted between the gain region and the absorber region.

10. The apparatus according to claim 1, wherein said housing is a TO-can.

11. The apparatus according to claim 1, wherein superluminescent light-emitting diode is placed centrally in the housing and the beam path coincides with the symmetry axis.

12. The apparatus according to claim 1, wherein the beam path is concentric with a disc-shaped body.

13. The apparatus according to claim 1, further comprising monitoring means for monitoring a photocurrent generated by radiation emitted in the gain region and absorbed in the absorber region of the PN junction, thereby producing a monitoring signal being a measure of the light emitted in the gain region.

* * * * *